United States Patent
Lou (10) Patent No.: US 11,567,104 B2
(45) Date of Patent: Jan. 31, 2023

(54) HIGH SPEED SIGNAL TRANSMITTING AND RECEIVING DETECTION DEVICE

(71) Applicant: teCat Technologies (Suzhou) Limited, Suzhou (CN)

(72) Inventor: Choon Leong Lou, Suzhou (CN)

(73) Assignee: TECAT TECHNOLOGIES (SUZHOU) LIMITED, Suzhou (CN)

( * ) Notice: Subject to any disclaimer, the term of this patent is extended or adjusted under 35 U.S.C. 154(b) by 0 days.

(21) Appl. No.: 17/364,836

(22) Filed: Jun. 30, 2021

(65) Prior Publication Data

US 2022/0221488 A1      Jul. 14, 2022

(30) Foreign Application Priority Data

Jan. 8, 2021   (CN) .......................... 202120052252.4

(51) Int. Cl.
  *G01R 1/067* (2006.01)
  *H05K 1/02* (2006.01)
  *G01R 1/073* (2006.01)

(52) U.S. Cl.
  CPC ..... *G01R 1/06766* (2013.01); *G01R 1/06727* (2013.01); *G01R 1/07342* (2013.01); *H05K 1/024* (2013.01); *H05K 1/0243* (2013.01); *H05K 2201/10151* (2013.01)

(58) Field of Classification Search
  CPC ............ G01R 1/06766; G01R 1/06727; G01R 1/07342; H05K 1/0243; H05K 1/024; H05K 2201/10151
  See application file for complete search history.

(56) References Cited

U.S. PATENT DOCUMENTS

| | | | |
|---|---|---|---|
| 2003/0114026 A1* | 6/2003 | Caldwell | H05K 3/3426 257/E23.068 |
| 2015/0198632 A1* | 7/2015 | Kim | G01R 1/07342 324/750.25 |
| 2020/0300893 A1* | 9/2020 | Lee | G01R 1/07342 |
| 2020/0379010 A1* | 12/2020 | Tienzo | G01R 1/07307 |

FOREIGN PATENT DOCUMENTS

JP         5731432 B2 *  6/2015   ......... G01R 1/06711

* cited by examiner

*Primary Examiner* — Paresh Patel
(74) *Attorney, Agent, or Firm* — Li & Cai Intellectual Property (USA) Office (57) ABSTRACT

A high speed signal transmitting and receiving detection device is provided. The high speed signal transmitting and receiving detection device includes a substrate unit and a plurality of probe units. The plurality of probe units pass through the substrate unit. The substrate unit includes a conducting space, a plurality of fillers and a plurality of barriers. Each of the fillers is arranged in the conducting space and between two of the probe units that are adjacent to each other. Each of the barriers is arranged in the conducting space and between the two of the probe units that are adjacent to each other. A capacitance effect between the two of the probe units that are adjacent to each other is formed through the filler and the barrier that correspond to the two of the probe units that are adjacent to each other.

10 Claims, 5 Drawing Sheets

HIGH SPEED SIGNAL TRANSMITTING AND RECEIVING DETECTION DEVICE

CROSS-REFERENCE TO RELATED PATENT APPLICATION

This application claims the benefit of priority to China Patent Application No. 202120052252.4, filed on Jan. 8, 2021 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a high speed signal transmitting and receiving detection device that can be applied to high frequency signal detection.

BACKGROUND OF THE DISCLOSURE

In electrical test of semiconductor wafers, probe cards are used as detection devices to electrically connect an electrode of the semiconductor wafer to a circuit of a test wiring substrate that is separately disposed. To ensure an accuracy of wafer measurement, probe cards are usually tested before being dispatched from the factory or using by probe card detection devices.

One of detection methods is that a plurality of cables are pulled from the probe card detection device, and each of the plurality of cables connects one of a plurality of probes to the probe card device. The plurality of probes form an electrical loop with the probe card detection device, such that a connection between the probe card and the probe card detection device is formed and can be applied to detect abnormalities in the probe card. However, since the cable is used as a path of signal transmission in the above-mentioned method, more space is required to accommodate the cable, and a parasitic resistance value or an inductance value is increased due to an increase of cable length. Accordingly, the above-mentioned method cannot be accurately applied to high frequency or high speed signal detection.

Therefore, how to overcome the above-mentioned inadequacies through improving the structural design has become one of the important issues to be solved in the field.

SUMMARY OF THE DISCLOSURE

In response to the above-referenced technical inadequacies, the present disclosure provides a high speed signal transmitting and receiving detection device.

In one aspect, the present disclosure provides a high speed signal transmitting and receiving detection device that includes a substrate unit and a plurality of probe units. The plurality of probe units pass through the substrate unit. The substrate unit includes at least one conducting space, a plurality of fillers and a plurality of barriers. Each of the fillers is arranged in the at least one conducting space and between two of the probe units that are adjacent to each other. Each of the barriers is arranged in the at least one conducting space and between the two of the probe units that are adjacent to each other. A capacitance effect between the two of probe units that are adjacent to each other is formed through the filler and the barrier that correspond to the two of probe units that are adjacent to each other.

In certain embodiments, each of the barriers divides the filler that corresponds to the each of the barriers into two halves.

In certain embodiments, the substrate unit includes a first panel member and a second panel member. The at least one conducting space is defined as being between the first panel member and the second panel member.

In certain embodiments, the substrate unit is a circuit board, and each of the probe units is a cantilever probe.

In certain embodiments, each of the probe units is a vertical probe.

In another aspect, the present disclosure provides a high speed signal transmitting and receiving detection device that includes a substrate unit, at least one fixing unit and a plurality of probe units. The at least one fixing unit is connected to the substrate unit. The plurality of probe units pass through the at least one fixing unit and the substrate unit. The at least one fixing unit includes at least one conducting space, a plurality of fillers and a plurality of barriers. Each of the fillers is arranged in the at least one conducting space and between two of the probe units that are adjacent to each other. Each of the barriers is arranged in the at least one conducting space and between the two of the probe units that are adjacent to each other. A capacitance effect between the two of probe units that are adjacent to each other is formed through the filler and the barrier that correspond to the two of probe units that are adjacent to each other.

In certain embodiments, each of the barriers divides the filler that corresponds to each of the barriers into two halves.

In certain embodiments, the fixing unit includes a first fixing member and a second fixing member. The at least one conducting space is defined as being between the first fixing member and the second fixing member.

In certain embodiments, the substrate unit is a circuit board, and each of the probe units is a cantilever probe.

In certain embodiments, each of the probe units is a vertical probe.

Therefore, one of the beneficial effects of the present disclosure is that the detection accuracy and convenience of high frequency signal can be improved in the high speed signal transmitting and receiving detection device provided by the present disclosure by virtue of "the plurality of probe units passing through the substrate unit, the substrate unit including the at least one first conducting space, the plurality of first fillers and the plurality of first barriers, each of the first fillers being arranged in the at least one first conducting space and between the two of the probe units that are adjacent to each other, each of the barriers being arranged in the at least one first conducting space and between the two of the probe units that are adjacent to each other, and the capacitance effect between the two of the probe units that are adjacent to each other being formed through the first filler and the first barrier that correspond to the two of the probe units that are adjacent to each other".

Another one of the beneficial effects of the present disclosure is that the detection accuracy and convenience of high frequency signal can be improved in the high speed signal transmitting and receiving detection device provided by the present disclosure by virtue of "the at least one fixing unit being connected to the substrate unit, the plurality of probe units passing through the at least one fixing unit and the substrate unit, the at least one fixing unit including the at least one second conducting space, the plurality of second fillers and the plurality of second barriers, each of the second fillers being arranged in the second conducting space and between the two of the probe units that are adjacent to each other, each of the second barriers being arranged in the second conducting space and between the two of the probe units that are adjacent to each other, the capacitance effect being formed between the two of the probe units that are adjacent to each other through the second filler and the second barrier that correspond to the two of the probe units that are adjacent to each other".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
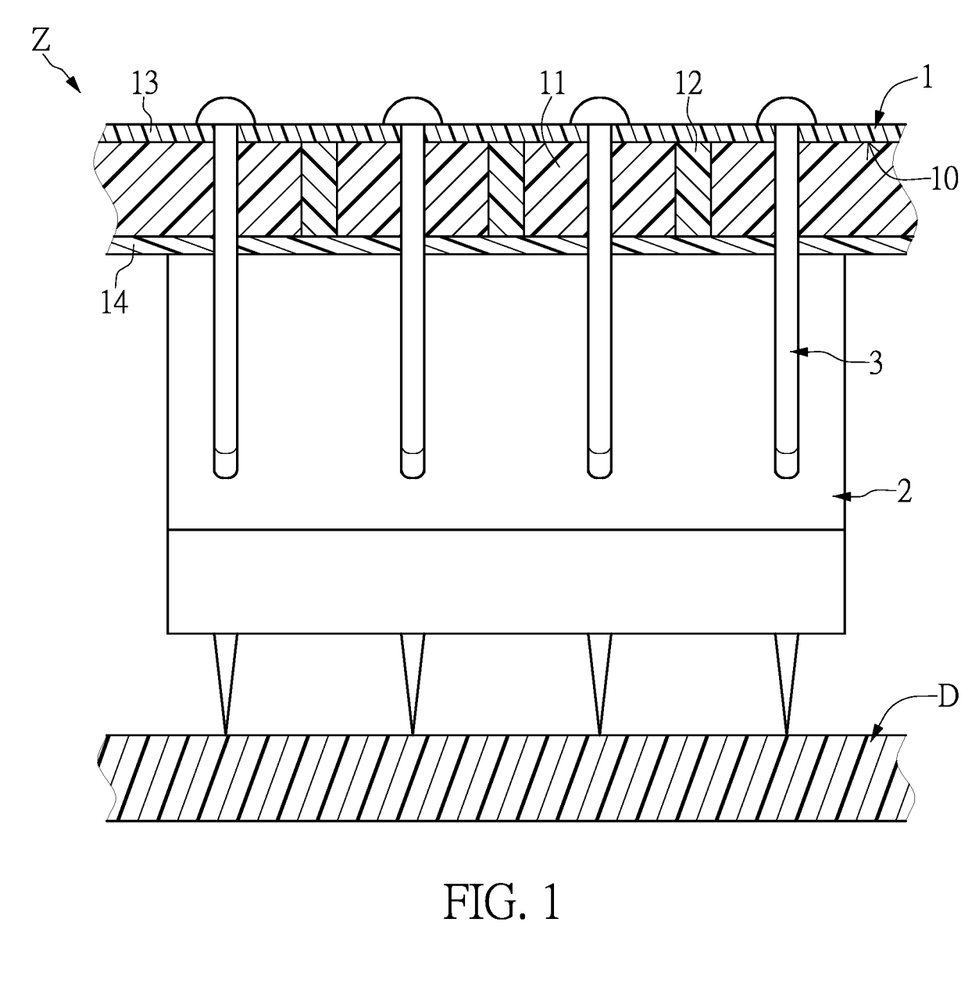
FIG. 1 is a partial schematic cross-sectional view of a high speed signal transmitting and receiving detection device according to a first embodiment of the present disclosure.

Referring to FIG. 1, a partial schematic cross-sectional view of a high speed signal transmitting and receiving detection device according to a first embodiment of the present disclosure is shown. As shown in the figure, the first embodiment of the present disclosure provides a high speed signal transmitting and receiving detection device Z that includes a substrate unit 1 and a plurality of probe units 3.

For example, as shown in FIG. 1, the high speed signal transmitting and receiving detection device Z in the present embodiment can be a cantilever probe card. The substrate unit 1 can be a circuit board of the probe card, but is not limited thereto. The plurality of probe units 3 pass through the substrate unit 1, and a distance between two of the probe units 3 that are adjacent to each other can be changed according to requirements of a manufacture or a user. Furthermore, as shown in FIG. 1, the substrate unit 1 can include at least one conducting space 10, a plurality of first fillers 11 and a plurality of first barriers 12. When the plurality of probe units 3 pass through the substrate unit 1, the plurality of probe units 3 divide one of the first conducting space 10 inside the substrate unit 1 into a plurality of first conducting spaces 10, and the two of the probe units 3 that are adjacent to each other have one of the plurality of first conducting spaces 10 therebetween. Each of the first fillers 11 can be an electrically conductive material, and each of the first barriers 12 can be an electrically insulating material. Each of the first fillers 11 is arranged in the first conducting space 10 and between the two of the probe units 3 that are adjacent to each other, that is, each of the probe units 3 can be completely covered by the first fillers 11 on both sides. Each of the first barriers 12 is arranged in the first conducting space 10 and between the two of the probe units 3 that are adjacent to each other. In addition, each of the first barriers 12 divides the first filler 11 that corresponds to the each of the first barriers 12 into two halves.

Accordingly, as shown in FIG. 1, a capacitance effect between the two of the probe units 3 is formed through the first filler 11 and the first barrier 12 that correspond to the two of the probe units 3 that are adjacent to each other. When the plurality of probe units 3 are in contact with a test object D, a high frequency loop-back test can be performed on the test object D through the plurality of probe units 3. Furthermore, through forming the capacitance effect between the two probe units 3 that are adjacent to each other, when the test object D transmits a detection signal to one of the two probe units 3 that are adjacent to each other, the capacitance effect can be used so that another one of the two probe units 3 that are adjacent to each other receives the detection signal and transmits the detection signal back to the test object D to complete the high frequency loop-back test before the detection signal is transmitted to the substrate unit 1.

Therefore, through the above technical solution, the first conducting space 10, the plurality of first fillers 11 and the plurality of first barriers 12 are disposed inside substrate unit 1 of the high speed signal transmitting and receiving detection device Z of the present disclosure, so that the capacitance effect can be formed between the two of the probe units 3 that are adjacent to each other and a test loop between the two of the probe units 3 that are adjacent to each other and the test object D is formed. Accordingly, the high speed signal transmitting and receiving detection device Z of the present disclosure can be used for the high frequency loop-back test of the test object D through the probe units 3.

Moreover, the substrate unit 1 of the present disclosure can include a first panel member 13 and a second panel member 14. The first conducting space 10 is defined as being between the first panel member 13 and the second panel member 14.

However, the aforementioned description for the high speed signal transmitting and receiving detection device of the first embodiment is merely an example and is not meant to limit the scope of the present disclosure.

Second Embodiment

Figure 2:
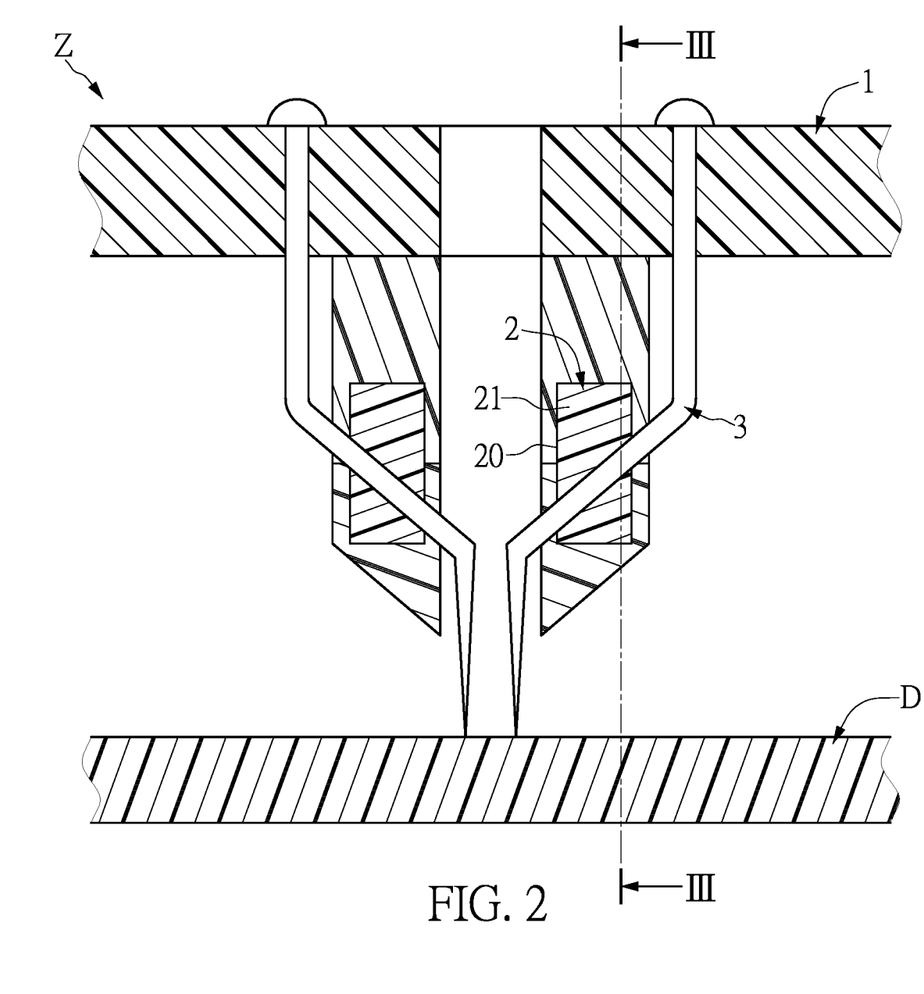
FIG. 2 is a partial schematic cross-sectional view of a high speed signal transmitting and receiving detection device according to a second embodiment of the present disclosure.
Figure 3:
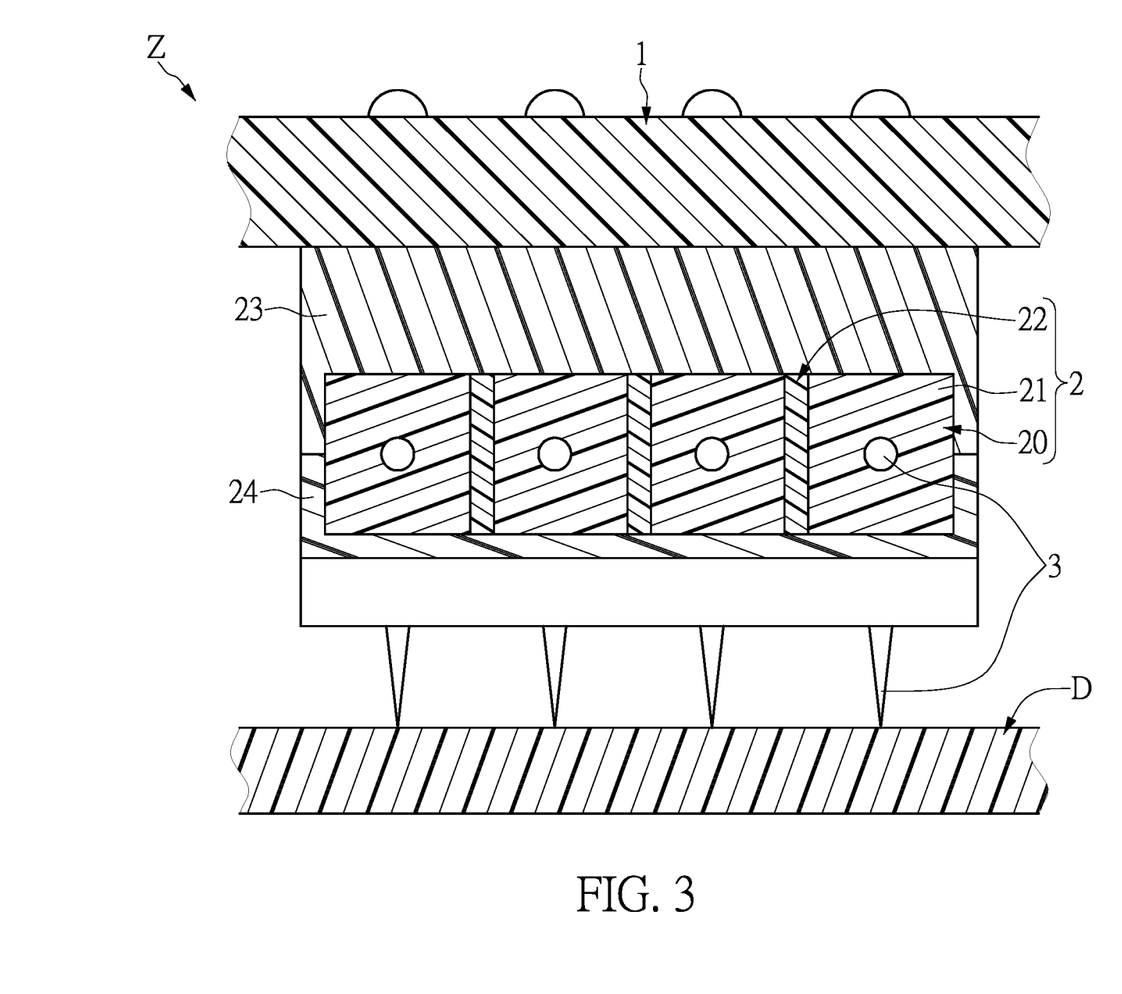
FIG. 3 is a schematic cross-sectional view taken along line III-III of FIG. 2.

Referring to FIG. 2 and FIG. 3, which is to be read in conjunction with FIG. 1, a partial schematic cross-sectional view of a high speed signal transmitting and receiving detection device according to a second embodiment of the present disclosure and a schematic cross-sectional view taken along line III-III of FIG. 2 are shown, respectively. As shown in the figures, the second embodiment of the present disclosure provides a high speed signal transmitting and receiving detection device Z that includes a substrate unit 1, at least one fixing unit 2 and a plurality of probe units 3. The at least one fixing unit 2 is connected to the substrate unit 1. The plurality of probe units 3 pass through the at least one fixing unit 2, and are electrically connected to the substrate unit 1. The at least one fixing unit 2 includes a second conducting space 20, a plurality of second fillers 21 and a plurality of second barriers 22. Each of the second fillers 21 is arranged in the second conducting space 20 and between two of the probe units 3 that are adjacent to each other. Each of the second barriers 22 is arranged in the second conducting space 20 and between the two of the probe units 3 that are adjacent to each other. A capacitance effect is formed between the two of the probe units 3 that are adjacent to each other through the second filler 21 and the second barrier 22 that correspond to the two of the probe units 3 that are adjacent to each other.

Specifically speaking, a comparison of FIG. 2 and FIG. 1 shows that a difference between the high speed signal transmitting and receiving detection device Z in the present embodiment and the high speed signal transmitting and receiving detection device Z in the first embodiment is that the high speed signal transmitting and receiving detection device Z in the present embodiment further includes the at least one fixing unit 2. The fixing unit 2 can be an annular block structure, but is not limited thereto. The fixing unit 2 can also be a geometrically shaped structure formed by a plurality of geometrically shaped block structures. For example, the fixing unit 2 can include a first fixing member 23 and a second fixing member 24, and the second conducting space 20 is defined as being between the first fixing member 23 and the second fixing member 24. The plurality of probe units 3 pass through the fixing unit 2 at an equal interval. One end of each of the plurality of probe units 3 is connected to the substrate unit 1, and another one end of each of the plurality of probe units 3 can be a needle structure for detecting a test object D (e.g., a wafer, but is not limited thereto).

Furthermore, as shown in FIG. 2 and FIG. 3, the fixing unit 2 has the second conducting space 20 arranged therein. When the plurality of probe units 3 pass through the fixing unit 2, the plurality of probe units 3 divide the second conducting space 20 into a plurality of second conducting spaces 20, that is, the two of the probe units 3 that are adjacent to each other have one of the plurality of second conducting spaces 20 therebetween. Each of the plurality of second conducting spaces 20 is filled with the second filler 21. Each of the second fillers 21 can be an electrically conductive material. In addition, each of plurality of second conducting spaces 20 also has one of the second barriers 22 disposed therein. Each of the second barriers 12 can be an electrically insulating material. In addition, each of the second barriers 22 divides the second filler 21 that corresponds to the each of the second barriers 22 into two halves.

Therefore, the capacitance effect between the two of the probe units 3 that are adjacent to each other is formed through the second filler 21 and the second barrier 22 that correspond to the two of the probe units 3 that are adjacent to each other. Accordingly, a high frequency loop-back test can be performed on the test object D through the plurality of probe units 3.

However, the aforementioned description for the high speed signal transmitting and receiving detection device of the first embodiment is merely an example and is not meant to limit the scope of the present disclosure.

Third Embodiment

Figure 4:
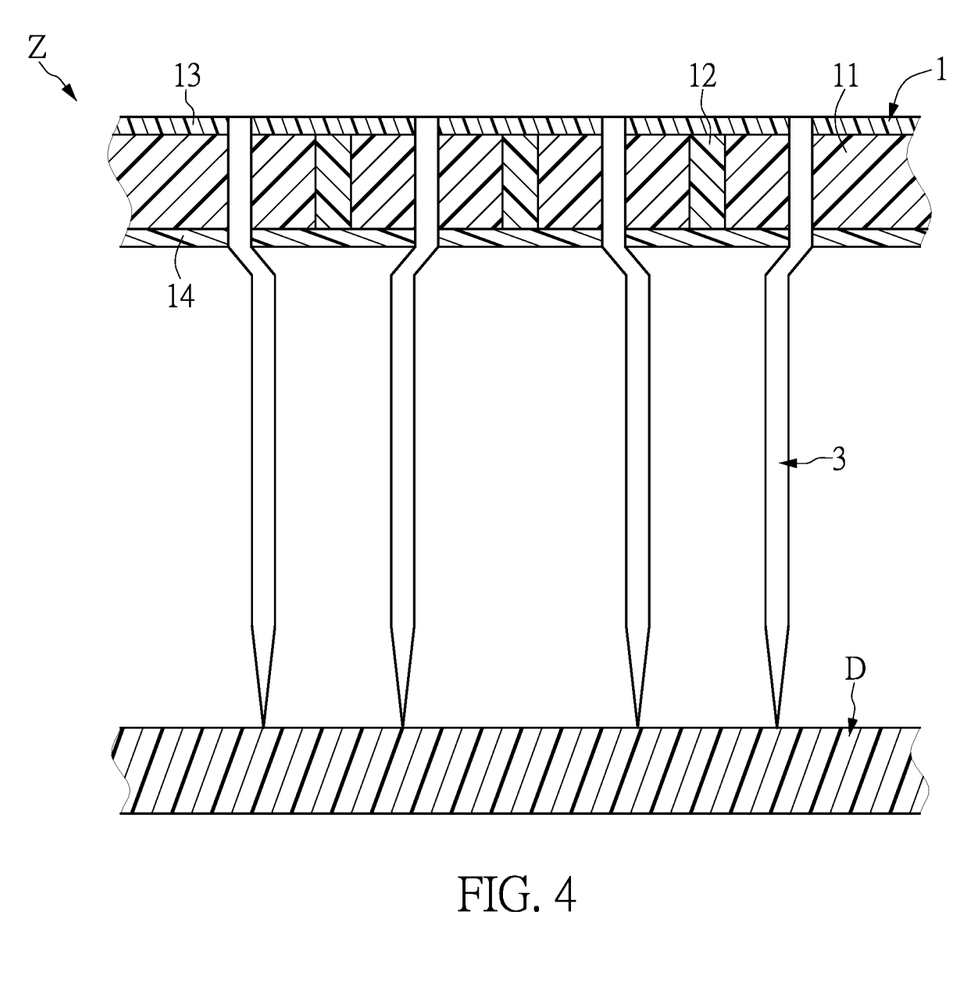
FIG. 4 is a partial schematic cross-sectional view of a high speed signal transmitting and receiving detection device according to a third embodiment of the present disclosure.

Referring to FIG. 4, which is to be read in conjunction with FIG. 1 to FIG. 3, a partial schematic cross-sectional view of a high speed signal transmitting and receiving detection device according to a third embodiment of the present disclosure is shown. As shown in the figures, an actuation of the same component in the high speed signal transmitting and receiving detection device Z in the present embodiment is similar to that in the first embodiment described above, and will not be reiterated herein. It should be noted that a comparison of FIG. 4 and FIG. 1 shows that a difference between the high speed signal transmitting and receiving detection device Z in the present embodiment and the high speed signal transmitting and receiving detection device Z in the first embodiment is that the high speed signal transmitting and receiving detection device Z in the present embodiment can be a cantilever probe card. In addition, the substrate unit 1 can also include the at least one first conducting space 10, the plurality of first fillers 11 and the plurality of first barriers 12, and the plurality of probe units 3 can pass through the substrate unit 1.

Accordingly, as shown in FIG. 4, a capacitance effect between two of the probe units 3 that are adjacent to each other is formed through the first filler 11 and the first barrier 12 that correspond to the two of the probe units 3 that are adjacent to each other. When the plurality of probe units 3 are in contact with the test object D, the high frequency loop-back test can be performed on the test object D through the plurality of probe units 3. Furthermore, through forming the capacitance effect between the two probe units 3 that are adjacent to each other, when the test object D transmits a detection signal to one of the two probe units 3 that are adjacent to each other, the capacitance effect can be used so that another one of the two probe units 3 that are adjacent to each other receives the detection signal and transmits the detection signal back to the test object D to complete a high frequency loop-back test before the detection signal is transmitted to the substrate unit 1.

However, the aforementioned description for the high speed signal transmitting and receiving detection device of the first embodiment is merely an example and is not meant to limit the scope of the present disclosure.

Fourth Embodiment

Figure 5:
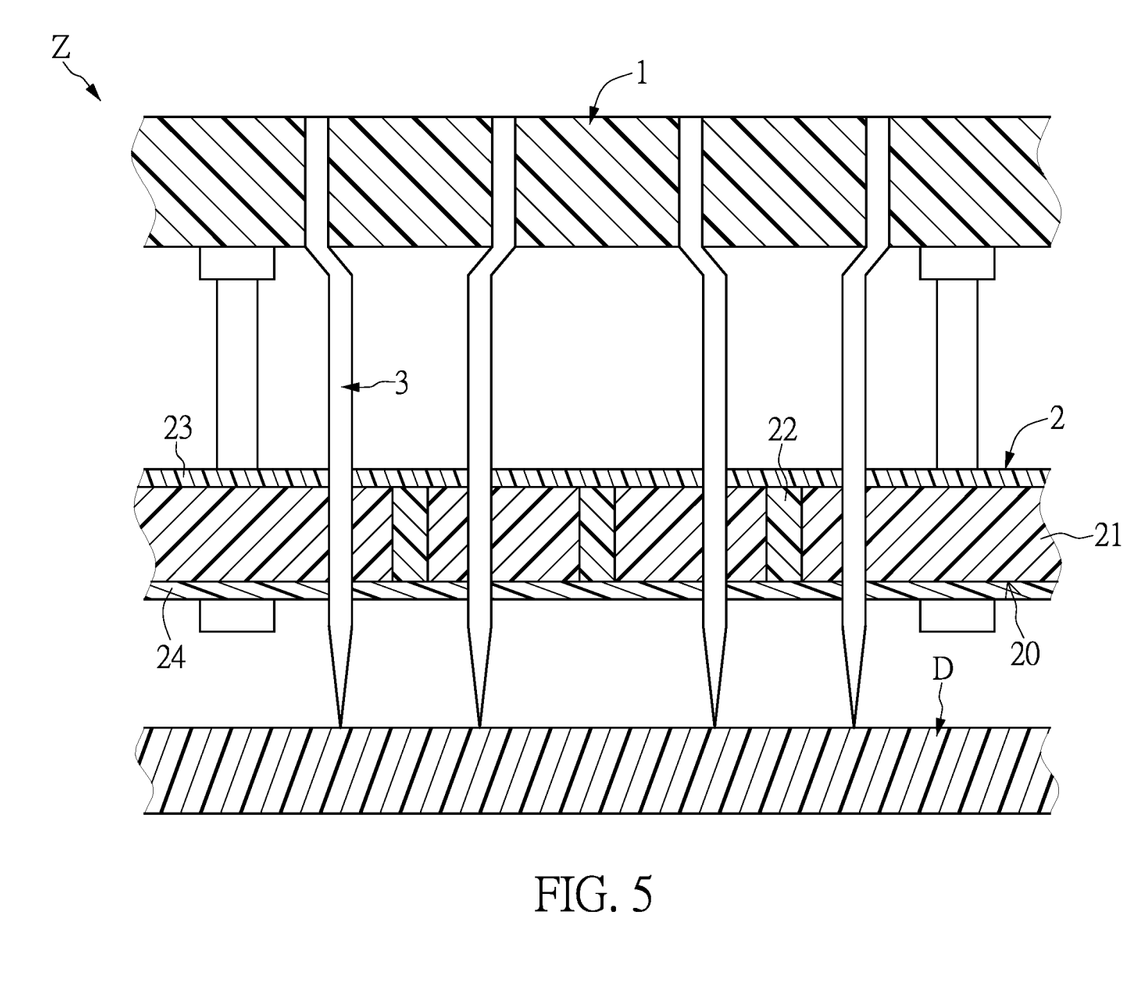
FIG. 5 is a partial schematic cross-sectional view of a high speed signal transmitting and receiving detection device according to a fourth embodiment of the present disclosure.

Referring to FIG. 5, which is to be read in conjunction with FIG. 1 to FIG. 4, a partial schematic cross-sectional view of a high speed signal transmitting and receiving detection device according to a fourth embodiment of the present disclosure is shown. As shown in the figures, an actuation of the same component in the high speed signal transmitting and receiving detection device Z in the present embodiment is similar to that in the embodiments described above, and will not be reiterated herein. It should be noted that a comparison of FIG. 5 and FIG. 4 shows that a difference between the high speed signal transmitting and receiving detection device Z in the present embodiment and the high speed signal transmitting and receiving detection device Z in the third embodiment is that the high speed signal transmitting and receiving detection device Z in the present embodiment can further include at least one fixing unit 2. The fixing unit 2 can be a carrier plate structure, but is not limited thereto. The fixing unit 2 can also be a geometrically shaped structure formed by a plurality of geometrically shaped carrier plate structures. For example, the fixing unit 2 can include the first fixing member 23 and the second fixing member 24, and the second conducting space 20 is defined as being between the first fixing member 23 and the second fixing member 24. The plurality of probe units 3 pass through the fixing unit 2 at an equal interval. One end of each of the plurality of probe units 3 is connected to the substrate unit 1, and another one end of each of the plurality of probe units 3 can be a needle structure for detecting the test object D (e.g., a wafer, but is not limited thereto).

Therefore, a capacitance effect between two of the probe units 3 that are adjacent to each other is formed through the second filler 21 and the second barrier 22 that correspond to the two of the probe units 3 that are adjacent to each other. Accordingly, a high frequency loop-back test can be performed on the test object D through the plurality of probe units 3.

However, the aforementioned description for the high speed signal transmitting and receiving detection device of the first embodiment is merely an example and is not meant to limit the scope of the present disclosure.

Beneficial Effects of the Embodiments

In conclusion, one of the beneficial effects of the present disclosure is that the high speed signal transmitting and receiving detection device Z of the present disclosure can achieve an effect of performing high speed signal detection by virtue of "the plurality of probe units 3 passing through the substrate unit 1, the substrate unit 1 including the at least one first conducting space 10, the plurality of first fillers 11 and the plurality of first barriers 12, each of the first fillers 11 being arranged in the at least one first conducting space 10 and between the two of the probe units 3 that are adjacent to each other, each of the barriers 12 being arranged in the at least one first conducting space 10 and between the two of the probe units 3 that are adjacent to each other, and the test loop between the two of the probe units 3 that are adjacent to each other being formed through the first filler 11 and the first barrier 12 that correspond to the two of the probe units 3 that are adjacent to each other".

Another one of the beneficial effects of the present disclosure is that the detection accuracy and convenience of high frequency signal can be improved in the high speed signal transmitting and receiving detection device Z of the present disclosure by virtue of "the at least one fixing unit 2 being connected to the substrate unit 1, the plurality of probe units 3 passing through the at least one fixing unit 2 and being electrically connected to the substrate unit 1, the at least one fixing unit 2 including the at least one second conducting space 20, the plurality of second fillers 21 and the plurality of second barriers 22, each of the second fillers 21 being arranged in the second conducting space 20 and between the two of the probe units 3 that are adjacent to each other, each of the second barriers 22 being arranged in the second conducting space 20 and between the two of the probe units 3 that are adjacent to each other, the capacitance effect being formed between the two of the probe units 3 that are adjacent to each other through the second filler 21 and the second barrier 22 that correspond to the two of the probe units 3 that are adjacent to each other".

Furthermore, the first conducting space 10 is disposed inside the substrate unit 1, and the first filler 11 as well as the first barrier 12 are disposed inside the first conducting space 10, or the second conducting space 20 is disposed inside the fixing unit 2, and the second filler 21 as well as the second barrier 22 are disposed inside the second conducting space 20 of the high speed signal transmitting and receiving detection device Z provided by the present disclosure, so that the capacitance effect can be formed between the two of the probe units 3 that are adjacent to each other and the test loop between the two of the probe units 3 that are adjacent to each other and the test object D is formed. Accordingly, the high speed signal transmitting and receiving detection device Z of the present disclosure can be used for the high frequency loop-back test of the test object D through the probe units 3.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A high speed signal transmitting and receiving detection device, comprising:
   a substrate unit; and
   a plurality of probe units passing through the substrate unit;
   wherein the substrate unit includes at least one conducting space, a plurality of fillers and a plurality of barriers, each of the fillers is arranged in the at least one conducting space and between two of the probe units that are adjacent to each other, and each of the barriers is arranged in the at least one conducting space and between the two of the probe units that are adjacent to each other;

wherein a capacitance effect between the two of the probe units that are adjacent to each other is formed through the filler and the barrier that correspond to the two of the probe units that are adjacent to each other;

wherein each of the barriers divides the filler that corresponds to each of the barriers into two halves.

2. The high speed signal transmitting and receiving detection device according to claim 1, wherein the substrate unit includes a first panel member and a second panel member, and the at least one conducting space is defined as being between the first panel member and the second panel member.

3. The high speed signal transmitting and receiving detection device according to claim 1, wherein the substrate unit is a circuit board, and each of the probe units is a cantilever probe.

4. The high speed signal transmitting and receiving detection device according to claim 1, wherein each of the probe units is a vertical probe.

5. A high speed signal transmitting and receiving detection device, comprising:
- a substrate unit;
- at least one fixing unit connected to the substrate unit; and
- a plurality of probe units passing through the at least one fixing unit and the substrate unit;

wherein the at least one fixing unit includes at least one conducting space, a plurality of fillers and a plurality of barriers, each of the fillers is arranged in the at least one conducting space and between two of the probe units that are adjacent to each other, and each of the barriers is arranged in the at least one conducting space and between the two of the probe units that are adjacent to each other;

wherein a capacitance effect between the two of the probe units that are adjacent to each other is formed through the filler and the barrier that correspond to the two of the probe units that are adjacent to each other;

wherein each of the barriers divides the filler that corresponds to each of the barriers into two halves.

6. The high speed signal transmitting and receiving detection device according to claim 5, wherein the fixing unit includes a first fixing member and a second fixing member, and the at least one conducting space is defined as being between the first fixing member and the second fixing member.

7. The high speed signal transmitting and receiving detection device according to claim 5, wherein the substrate unit is a circuit board, and each of the probe units is a cantilever probe.

8. The high speed signal transmitting and receiving detection device according to claim 5, wherein each of the probe units is a vertical probe.

9. The high speed signal transmitting and receiving detection device according to claim 1, wherein each of the fillers is an electrically conductive material and each of the barriers is an electrically insulating material.

10. The high speed signal transmitting and receiving detection device according to claim 5, wherein each of the fillers is an electrically conductive material and each of the barriers is an electrically insulating material.

* * * * *